(12) United States Patent
Huang et al.

(10) Patent No.: US 7,399,573 B2
(45) Date of Patent: Jul. 15, 2008

(54) METHOD FOR USING NEGATIVE TONE SILICON-CONTAINING RESIST FOR E-BEAM LITHOGRAPHY

(75) Inventors: Wu-Song S. Huang, Poughkeepsie, NY (US); Lidija Sekaric, Mount Kisco, NY (US); James J. Bucchignano, Yorktown Heights, NY (US); David P. Klaus, Yorktown Heights, NY (US); Raman Viswanathan, Briarcliff Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 108 days.

(21) Appl. No.: 11/552,677

(22) Filed: Oct. 25, 2006

(65) Prior Publication Data
US 2008/0102400 A1    May 1, 2008

(51) Int. Cl.
*G03C 7/075* (2006.01)
(52) U.S. Cl. .................. 430/270.1; 430/325; 430/905
(58) Field of Classification Search .............. 430/270.1, 430/325, 905
See application file for complete search history.

(56) References Cited

U.S. PATENT DOCUMENTS

| | | | |
|---|---|---|---|
| 5,350,485 A | 9/1994 | Shiraishi et al. | |
| 6,803,171 B2 | 10/2004 | Gronbeck et al. | |
| 6,842,577 B2 | 1/2005 | Shelnut et al. | |
| 2003/0224560 A1 | 12/2003 | Odaka et al. | |
| 2004/0209187 A1 | 10/2004 | Barclay et al. | |
| 2004/0265754 A1 | 12/2004 | Barclay et al. | |
| 2007/0281098 A1* | 12/2007 | Hirayama et al. | ........... 427/387 |

* cited by examiner

*Primary Examiner*—Richard Schilling
(74) *Attorney, Agent, or Firm*—Steven Capella

(57) ABSTRACT

The negative resist compositions especially suitable for electron beam-based lithographic processes are obtained by using a polymeric component containing first silsesquioxane moieties functionalized with a first reactive group having a first crosslinking reactivity and a first dissolution rate in aqueous alkaline solutions, and second silsesquioxane moieties functionalized with a second reactive group having a second crosslinking reactivity and a second dissolution rate in aqueous alkaline solutions, said reactivities being different from one another and said dissolution rates being different from one another. These negative resists enable improved negative lithographic processes, especially in the context of mask-making and direct-write techniques using electron beam lithography. The negative resists are also useful more generally in methods of forming patterned material features and advantageously show reduced incidence of image collapse at smaller groundrules.

15 Claims, No Drawings

US 7,399,573 B2

METHOD FOR USING NEGATIVE TONE SILICON-CONTAINING RESIST FOR E-BEAM LITHOGRAPHY

This invention was made with Government support under Contract No. N-66001-00-C-8083 awarded by the Dept. of the United States Navy, Space and Warfare Systems Center. The Government has certain rights in this invention.

BACKGROUND OF THE INVENTION

In the microelectronics industry as well as in other industries involving construction of microscopic structures (e.g. micromachines, magnetoresistive heads, etc.), lithography is used to obtain patterned structures of various materials such as insulators, semiconductors and/or metals in a sequence leading to the achievement of the desired structure.

Most lithographic processes (excluding so-called direct-write techniques) typically employ some type of patterned mask through which the imaging radiation is projected onto the resist material to be patterned on the substrate of interest. Typically, the mask itself is formed by a lithographic technique such as direct-write electron beam lithography or in some instances by projection UV lithography (especially deep UV—248 nm) using an appropriate resist material. Typically, the mask comprises a patterned metal layer(s) (e.g., chromium) on a quartz plate (or other transparent plate).

The introduction of chemically amplified (CA) resist for electron beam lithography has reduced the writing time dramatically for mask making, however, for low pattern density circuitry, it would still take a long time to write the images using positive resist. Therefore, it is more desirable to have negative tone system for electron beam lithography. Most traditional negative tone CA resists are using phenolic polymers as base resin. Phenolic systems are usually too high in dissolution rate in the 0.263N TMAH developer that has become standard in the industry. Other known negative resist systems are often prone to excessive microbridging.

Thus, there is a need for improved negative tone resist compositions especially suitable for electron beam lithography, as well as for lithographic processes employing such resists to create patterned material features, especially in the context of making lithographic masks.

SUMMARY OF THE INVENTION

The invention provides improved resists for negative tone lithography, especially for electron beam lithography. The resist compositions of the invention are generally characterized by the presence of an imaging polymer having a silsesquioxane backbone polymer with pendant groups having different crosslinking reactivity and base solubility. The pendant groups may be present on a single silsesquioxane backbone polymer or may be present as a blend of silsesquioxane polymers. The resists of the invention advantageously provide improved dissolution characteristics which enable their use as negative tone resist in electron beam lithography applications with minimal or no microbridging.

In one aspect, the invention encompasses negative resist compositions comprising:
(a) a polymeric component containing first silsesquioxane moieties functionalized with a first reactive group having a first crosslinking reactivity and a first dissolution rate in aqueous alkaline solutions, and second silsesquioxane moieties functionalized with a second reactive group having a second crosslinking reactivity and a second dissolution rate in aqueous alkaline solutions, the reactivities being different from one another and the dissolution rates being different from one another,
(b) a crosslinking component, and
(c) a radiation-sensitive acid generator.

The polymeric component preferably comprises silsesquioxane polymer having both reactive groups on the same polymer. Alternatively, the polymeric component may comprise a blend of silsesquioxane polymers, each having different reactive groups. The polymeric component preferably contains In another aspect, the invention encompasses a method of creating a patterned material structure on a substrate, the method comprising:
(a) providing a material surface on a substrate,
(b) providing a layer of negative resist over the surface, the negative resist comprising (i) a polymeric component containing first silsesquioxane moieties functionalized with a first reactive group having a first crosslinking reactivity and a first dissolution rate in aqueous alkaline solutions, and second silsesquioxane moieties functionalized with a second reactive group having a second crosslinking reactivity and a second dissolution rate in aqueous alkaline solutions, the reactivities being different from one another and the dissolution rates being different from one another, (ii) a crosslinking component, and (iii) a radiation-sensitive acid generator,
(c) patternwise exposing portions of the resist to imaging radiation,
(d) removing resist except for the exposed portions to form spaces defined by remaining exposed portions of the resist layer, and
(e) removing or ion implanting portions of the material at the spaces, thereby forming the patterned material feature.

The material surface provided in step (a) is preferably selected from the group consisting of metals and semiconductors, more preferably a chromium-containing metal.

These and other aspects of the invention are discussed in further detail below.

DETAILED DESCRIPTION OF THE INVENTION

The invention provides improved resists for negative tone lithography, especially for electron beam lithography. The resist compositions of the invention are generally characterized by the presence of an imaging polymer having a silsesquioxane backbone polymer with pendant groups having different crosslinking reactivity and base solubility. The term of crosslinking reactivity has been some times referred to the reactivity of a crosslinker. Here the crosslinking reactivity is the reactivity of the functional group on the resin polymer toward the crosslinker. The pendant groups may be present on a single silsesquioxane backbone polymer or may be present as a blend of silsesquioxane polymers. The resists of the invention advantageously provide improved dissolution characteristics which enable their use as negative tone resist in electron beam lithography applications with minimal or no microbridging.

The resist compositions of the invention are characterized in part by the presence of a polymeric component where the polymeric component contains first silsesquioxane moieties functionalized with a first reactive group having a first crosslinking reactivity and a first dissolution rate in aqueous alkaline solutions, and second silsesquioxane moieties functionalized with a second reactive group having a second crosslinking reactivity and a second dissolution rate in aqueous alkaline solutions, the reactivities being different from one another and the dissolution rates being different from one another.

More specifically, the resist compositions of the invention are characterized by the presence of:
(a) a polymeric component containing first silsesquioxane moieties functionalized with a first reactive group having a first crosslinking reactivity and a first dissolution rate in aqueous alkaline solutions, and second silsesquioxane moieties functionalized with a second reactive group having a second crosslinking reactivity and a second dissolution rate in aqueous alkaline solutions, the reactivities being different from one another and the dissolution rates being different from one another,
(b) a crosslinking component, and
(c) a radiation-sensitive acid generator.

The silsesquioxane moieties are preferably monomeric units of the structures:

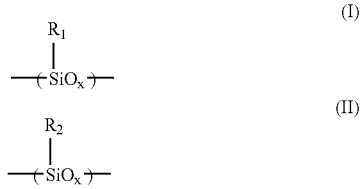

where x is about 1.5, $R_1$ is a group which contains a first reactive group having a first crosslinking reactivity and a first dissolution rate in aqueous alkaline solutions, and $R_2$ contains a second reactive group having a second crosslinking reactivity and a second dissolution rate in aqueous alkaline solutions, the respective reactivities of $R_1$ and $R_2$ being different from one another and the respective dissolution rates of $R_1$ and $R_2$ being different from one another. The monomeric units (I) and (II) may be present together in the same polymer or may be present in different polymers (i.e., as a blend of polymers).

$R_1$ preferably contains a reactive moiety selected from the group consisting of fluoroalcohols, alkylalcohols, and diacarboxyimides. More preferably, the reactive moiety is a fluoroalcohol selected from the group consisting of trifluoroalcohol, hexafluoroalcohol, and fluoroalkylalcohol.

$R_2$ preferably contains a reactive moiety selected from the group consisting of phenols, naphthols, hydroxyimides, carboxlic acids, amides, and sulfonamides.

The polymeric component preferably has a mole ratio of the first reactive group to said second reactive group is from about 15:1 to 1:15, more preferably about 6:1 to 1:6. The polymeric component preferably contains about 30-95 mole % of $R_1$ groups, more preferably about 65-90 mole %, and about 5-70 mole % of $R_2$ groups, more preferably about 10-35 mole %, the mole percent being based on the total moles of functional groups on the polymer. Some inert groups may also be incorporated in the polymeric component to enhance the resist performance. For etch resistance improvement, examples of these inert groups are those containing aromatic structures such as substituted and unsubstituted benzenes, naphthalenes, and anthracenes, and those containing cyclic and polycyclic structures such as cyclohexane, norbornane, admantane. For polarity improvement, examples of these inert groups are those containing ketones, sulfones, and lactones.

In general, the invention is not limited to any specific number of polymers which may make up the polymeric component. The polymers of the polymeric component preferably have a weight average molecular weight of about 1000-30000.

The polymers making up the resist of the invention may be made by techniques known in the art. It should be understood that the invention is not limited to any specific method of synthesizing the polymers. For example, it may be possible to polymerize monomers and then create the desired functionality or the functionality may be present on the monomers prior to polymerization.

The crosslinking component of the resist compositions of the invention is preferably a crosslinker that can be reacted with the polymer in a manner which is catalyzed by generated acid and/or by heating. Generally, the crosslinking component may be any suitable crosslinking agent which is otherwise compatible with the other components of the composition. The crosslinking agents preferably act to crosslink the polymeric component in the presence of a generated acid. Suitable organic crosslinking agents include, but are not limited to: amine-containing compounds, epoxy-containing compounds, compounds containing at least two vinyl ether groups, allyl substituted aromatic compounds, compounds containing at least two or more diazonaphthoquinone sulfonic acid ester groups and combinations thereof. Preferred crosslinking agents are glycoluril compounds such as tetramethoxymethyl glycoluril, methylpropyltetramethoxymethyl glycoluril, and methylphenyltetramethoxymethyl glycoluril, available under the POWDERLINK trademark from Cytec Industries, Inc. Other preferred crosslinking agents include 2,6-bis(hydroxymethyl)-p-cresol and compounds having the following structures:

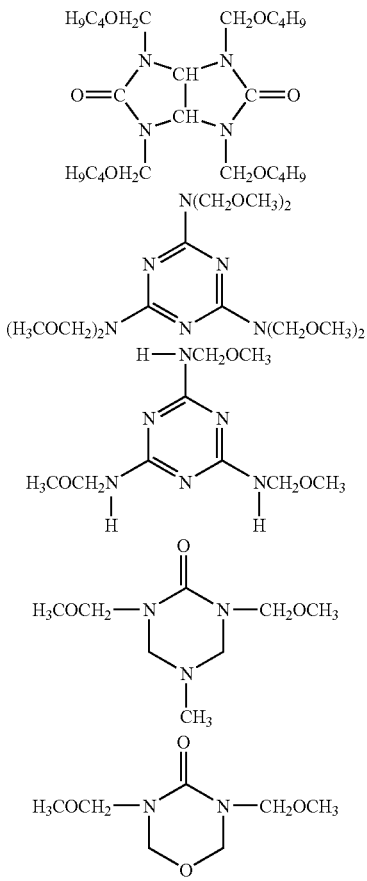

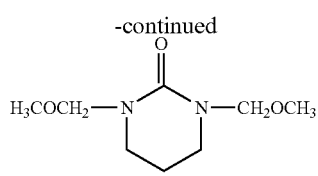

including their analogs and derivatives, such as those found in Japanese Laid-Open Patent Application (Kokai) No. 1-293339, as well as etherified amino resins, for example methylated or butylated melamine resins (N-methoxymethyl- or N-butoxymethyl-melamine respectively) or methylated/butylated glycolurils, for example as can be found in Canadian Patent No. 1,204,547. Other crosslinking agents such as bis-epoxies or bis-phenols (e.g., bisphenol-A) may also be used. Combinations of crosslinking agents may be used.

The resist compositions of the invention contain a radiation-sensitive acid generator. The invention is not limited to the use of any specific acid generator or combination of acid generators, that is the benefits of the invention may be achieved using various acid generators known in the art. Examples of suitable radiation-sensitive acid generators include (but preferably with alkyl substituted for one or more of any indicated aryl moieties) onium salts such as triaryl sulfonium hexafluoroantimonate, diaryliodonium hexafluoroantimonate, hexafluoroarsenates, triflates, perfluoroalkane sulfonates (e.g., perfluoromethane sulfonate, perfluorobutane sulfonate, perfluorohexane sulfonate, perfluorooctane sulfonate etc.), substituted aryl sulfonates such as pyrogallols (e.g. trimesylate of pyrogallol or tris(sulfonate) of pyrogallol), sulfonate esters of hydroxyimides, N-sulfonyloxynaphthalimides (N-camphorsulfonyloxynaphthalimide, N-pentafluorobenzenesulfonyloxynaphthalimide), α, α' bis-sulfonyl diazomethanes, naphthoquinone-4-diazides, alkyl disulfones and others. The radiation-sensitive acid generator should be compatible with the other components of the resist composition. If desired, combinations of radiation-sensitive acid generators may be used.

The resist compositions of the invention will typically contain a solvent prior to their application to the desired substrate. The solvent may be any solvent conventionally used with acid-catalyzed resists which otherwise does not have any excessively adverse impact on the performance of the resist composition. Preferred solvents are propylene glycol monomethyl ether acetate and cyclohexanone.

The compositions of the invention may further contain minor amounts of auxiliary components such as dyes/sensitizers, base additives, etc. as are known in the art. Preferred base additives are bases which scavenge trace acids while not having an excessive impact on the performance of the resist. Preferred base additives are (aliphatic or alicyclic) tertiary alkyl amines or tetraalkyl ammonium hydroxides such as tetrabutyl ammonium hydroxide (TBAH).

The resist compositions of the invention preferably contain about 1-30 wt. % (more preferably, about 3-15 wt. %) of crosslinking component based on the total weight of the polymeric component in the composition. The resist compositions of the invention preferably contain about 0.5-20 wt. % (more preferably about 3-15 wt. %) acid generator based on the total weight of the polymeric component in the composition. Where a solvent is present, the overall composition preferably contains about 50-98 wt. % solvent. The composition preferably contains about 1 wt. % or less of said base additive based on the total weight of polymeric component.

The resist compositions of the invention can be prepared by combining the polymeric component, crosslinking component, and acid generator and any other desired ingredients using conventional methods. The resist composition to be used in lithographic processes will generally have a significant amount of solvent.

The resist compositions of the invention are especially useful for lithographic processes used in the manufacture of integrated circuits on semiconductor substrates. The compositions are especially useful for lithographic processes using electron beam radiation. Where use of other radiation (e.g. mid-UV, 248 nm deep UV, 193 nm UV, or x-ray) is desired, the compositions of the invention can be adjusted (if necessary) by the addition of an appropriate dye or sensitizer to the composition.

The invention encompasses a method of creating a patterned material structure on a substrate, the method comprising:

(a) providing a material surface on a substrate, (b) providing a layer of negative resist over the surface, the negative resist comprising (i) a polymeric component containing first silsesquioxane moieties functionalized with a first reactive group having a first crosslinking reactivity and a first dissolution rate in aqueous alkaline solutions, and second silsesquioxane moieties functionalized with a second reactive group having a second crosslinking reactivity and a second dissolution rate in aqueous alkaline solutions, the reactivities being different from one another and the dissolution rates being different from one another, (ii) a crosslinking component, and (iii) a radiation-sensitive acid generator, (c) patternwise exposing portions of the resist to imaging radiation, (d) removing resist except for the exposed portions to form spaces defined by remaining exposed portions of the resist layer, and (e) removing or ion implanting portions of the material at the spaces, thereby forming the patterned material feature.

The material layer of the substrate may be a metal conductor layer, a ceramic insulator layer, a semiconductor layer or other material depending on the stage of the manufacture process and the desired material set for the end product. The invention is most useful in the context where the material layer to be patterned is a metal, more preferably a chromium-containing metal. The material to be patterned may be applied using any suitable technique. The substrate is preferably a semiconductor wafer or a glass (e.g., fused quartz) plate.

If desired, an antireflective coating (ARC) may be applied over the material layer before application of the resist layer. The ARC layer may be any conventional ARC which is compatible with acid catalyzed resists, the underlying material layer, subsequent processing.

Typically, the solvent-containing resist composition may then be applied to the desired substrate using spin coating or other technique. The substrate with the resist coating is then preferably heated (pre-exposure baked) to remove the solvent and improve the coherence of the resist layer. The thickness of the applied layer is preferably as thin as possible with the provisos that the thickness is preferably substantially uniform and that the resist layer be sufficient to withstand subsequent processing (typically reactive ion etching) to transfer the lithographic pattern to the underlying substrate material layer. The pre-exposure bake step is preferably conducted for about 10 seconds to 15 minutes, more preferably about 15 seconds to one minute. The pre-exposure bake temperature may vary depending on the glass transition temperature of the resist.

After solvent removal, the resist layer is then patternwise-exposed to the desired radiation (e.g., electron beam or deep UV radiation). Where scanning particle beams (such as scanning electron beam) are used, patternwise exposure may be achieved by scanning the beam across the substrate to selectively apply the beam energy in the desired pattern. Where wavelike radiation forms such as 248 nm ultraviolet radiation, the patternwise exposure is typically conducted through a mask which is placed over the resist layer. For 248 nm UV radiation, the total exposure energy is preferably about 100 millijoules/cm$^2$ or less, more preferably about 50 millijoules/cm$^2$ or less (e.g. 15-30 millijoules/cm$^2$).

After the desired patternwise exposure, the resist layer is typically baked to further complete the acid-catalyzed crosslinking reaction and to enhance the contrast of the resulting pattern. The post-exposure bake is preferably conducted at about 60-175° C., more preferably about 90°-160° C. The post-exposure bake is preferably conducted for about 30 seconds to 5 minutes.

After post-exposure bake, the resist structure with the desired pattern is obtained (developed) by contacting the resist layer with an alkaline solution which selectively dissolves the areas of the resist which were not exposed to radiation. Preferred alkaline solutions (developers) are aqueous solutions of tetramethyl ammonium hydroxide. Preferably, the resist compositions of the invention can be developed with conventional 0.26N aqueous alkaline solutions. The resist compositions of the invention can also be developed using 0.14N or 0.21N or other aqueous alkaline solutions. The resulting resist structure on the substrate is then typically dried to remove any remaining developer solvent.

The pattern from the resist structure may then be transferred to the material (e.g., ceramic, metal or semiconductor) of the underlying substrate. Typically, the transfer is achieved by reactive ion etching or some other etching technique. The most preferred application for the resist materials of the invention is in the patterning of metal layers, especially chromium-containing metal compositions as are commonly used for mask-making. In such applications, a halogen compound-containing pattern transfer etchant where the halogen is Cl, Br or I is typically used (e.g., $Cl_2$, $Br_2$, $I_2$, and $BCl_3$). The halogen compound-containing etchant may contain a combination of halogen compounds and/or may contain additional compounds such as a strong oxidant (e.g., $O_2$). A combination of $Cl_2$ and $O_2$ is a generally preferred etchant. The etching process described in U.S. Pat. No. 5,948,570 except that no post-development oxidation step is required using the resist of the present invention. The disclosure of U.S. Pat. No. 5,948,570 is incorporated herein by reference. Other suitable etching techniques also may be used.

The compositions of the invention and resulting resist structures can be used to create other patterned material layer structures such as metal wiring lines, holes for contacts or vias, insulation sections (e.g., damascene trenches or shallow trench isolation), trenches for capacitor structures, etc. as might be used in the design of integrated circuit devices. Preferably, however, the compositions of the invention are used in electron beam lithography for mask making (e.g., where the substrate is a quartz plate) or in direct write electron beam lithography for directly patterning resist layers on a wafer.

The processes for making these (ceramic, metal, semiconductor, etc.) features generally involve providing a material layer or section of the substrate to be patterned, applying a layer of resist over the material layer or section, patternwise exposing the resist to radiation, developing the pattern by contacting the resist layer with a solvent, etching the layer(s) underlying the resist layer at spaces in the pattern whereby a patterned material layer or substrate section is formed, and removing any remaining resist from the substrate. In some instances, a hard mask may be used below the resist layer to facilitate transfer of the pattern to a further underlying material layer or section. It should be understood that the invention is not limited to any specific lithography technique or device structure.

EXAMPLE 1

Hydrolysis of 2-acetoxy-3,3,3-trifluoropropyl trichlorosilane and 4-acetoxyphenylethyl trichlorosilane monomer mixture (70/30 mole ratio of monomers)

2-Acetoxy-3,3,3-trifluoropropyl trichlorosilane (30 grams, 0.104 mole) and 4-acetoxyphenylethyl trichlorosilane (13.27 grams, 0.0446 mole) monomer mixture in tetrahydrofuran (THF, 40 grams) were added dropwise into a cold solution (ice/water bath) of diethylamine (32.6 grams, 0.149 mole) and water (40 grams). The mixture was stirred at room temperature overnight. The mixture was then diluted with ether (25 ml), and the organic phase separated. The water phase was extracted with ether (2 times, 60 ml first, then 25ml), and the organic solutions were combined. The combined organic solution was washed with brine (2 times, 50 ml each) and dried over anhydrous magnesium sulfate overnight. The solvent was removed the next day by rotary evaporation.

EXAMPLE 2

Synthesis of poly(2-acetoxy-3,3,3-trifluoropropyl-silsesquioxane-co-4-acetoxyphenylethylsilsesquioxane) (70/30 mole ratio of monomers)

The product from EXAMPLE 1 was dissolved in toluene (40 grams) and placed in a round bottom flask equipped with a Dean-Stark water separator (to remove the water produced during condensation-reaction) and a water condenser. To this solution, potassium hydroxide (~70 mg) was added and the mixture was heated at 135° C. for 18 hours. Afterwards, the solution was filtered through a frit funnel, and the solvent was removed in a rotary evaporator.

EXAMPLE 3

Synthesis of: poly(2-hydroxy-3,3,3-trifluoropropyl-silsesquioxane-co-4-hydroxyphenylethylsilsesquioxane) (70/30 mole ratio of monomers, Polymer A)

Methanol (35 ml), tetrahydrofuran (50 ml) and ammonium hydroxide (30% solution in water, 43 ml) were added to the polymer product of EXAMPLE 2, and the resultant solution heated to mild reflux at 70° C. overnight. The solution was then cooled to room temperature and added dropwise into a mixture of water (1000 ml) and glacial acetic acid (30 ml). The resultant precipitated polymer (coagulated) was separated by decantation, rinsed with water (2 times, 300 ml each) and dried in a vacuum oven at 65° C. for short time. The polymer was re-dissolved in acetone and re-precipitated in mixture of water and acetic acid mixture and filtered with frit funnel and washed with water the same way as before. The collected polymer was dried in a vacuum oven at 65° C. for 24 hours. Yield: ~11 grams, Mw 7,230 and PD 1.15.

EXAMPLE 4

Resist Formulations

Resist A formulation was obtained by mixing equal amount of Polymer A (from EXAMPLE 3) and Polymer B (poly[2-hydroxy-3,3,3-trifluoropropylsilsesquioxane]) with 0.8 wt. % (relative to the polymer) tetrabutyl ammonium hydroxide (TBAH) and 8.2 wt. % triphenylsulfonium perfluorobutanesulfonate (TPS PFBUS) and 8% POWDERLINK crosslinker and ~300 ppm of FLUORAD™ FC-430 surfactant (available from 3M Company) in PGMEA solvent. The total solid weight content in the solution was about 8.5 wt. %.

Resist B formulation was obtained with the same amount of ingredients as Resist A except the polymer used in the formulation was poly(2-hydroxy-3,3,3-trifluoropropylsilsesquioxane-co-4-hydroxyphenylethylsilsesquioxane) (80/15 mole ratio of monomers).

EXAMPLE 5

Lithographic Evaluations

Resist A obtained from EXAMPLE 4 was spin coated with 3500 rpm on HMDS primed wafers. The film was baked on a hot plate at 110° C. for 1 minute to obtain thicknesses around 95 nm range. The exposures were performed on a 100 kV Leica exposure system. After exposure, the resist was baked at 110° C. for 60s before being developed with 0.263 N TMAH for 60s. Resolution of 45 nm line with 105 nm pitch and 50 nm line/space images were obtained at around 85-88 $\mu C/cm^2$ (no proximity correction).

The solid content of Resist B obtained from EXAMPLE 4 was adjusted to coat the resist in the range of about 60 nm thick. It was then processed the same way as Resist A. High resolution of 40 nm l/s images were obtained at 75 $\mu C/cm^2$ (no proximity correction). When the thickness of Resist B was changed to ~40 nm, 30 nm line/space images were resolved at 95 $\mu C/cm^2$ (no proximity correction).

What is claimed is:

1. A method of making a patterned material feature on a substrate, said method comprising:
   (a) providing a material surface on a substrate,
   (b) providing a layer of negative resist over said surface, said negative resist comprising (i) a polymeric component containing first silsesquioxane moieties functionalized with a first reactive group having a first crosslinking reactivity and a first dissolution rate in aqueous alkaline solutions, and second silsesquioxane moieties functionalized with a second reactive group having a second crosslinking reactivity and a second dissolution rate in aqueous alkaline solutions, said reactivities being different from one another and said dissolution rates being different from one another, (ii) a crosslinking component, and (iii) a radiation-sensitive acid generator,
   (c) patternwise exposing portions of said resist to imaging radiation,
   (d) removing resist except for said exposed portions to form spaces defined by remaining exposed portions of said resist layer, and
   (e) removing or ion implanting portions of said material at said spaces, thereby forming said patterned material feature.

2. The method of claim 1 further comprising heating said resist layer between steps (c) and (d) to promote crosslinking reaction in said exposed portions.

3. The method of claim 1 wherein said first and second silsesquioxane moieties are located in a polymer backbone of two separate polymers respectively.

4. The method of claim 1 wherein said first reactive group contains a fluoroalcohol, an alkylalcohol, or a diacarboxyimide moiety.

5. The method of claim 1 wherein said second reactive group contains a phenol, a naphthol, a hydroxyimide, a carboxlic acid, an amide, or a sulfonamide moiety.

6. The method of claim 3 wherein said polymer component comprises a blend of a fluoroalcohol-functionalized silsesquioxane polymer and a phenol-functionalized silisequioxane polymer.

7. The method of claim 1 wherein the mole ratio of said first reactive group to said second reactive group is from about 1:15-15:1.

8. The method of claim 4 wherein said fluoroalcohol is selected from the group consisting of trifluoroalcohol, trifluoroalcohol, hexafluoroalcohol, and fluoroalkylalcohol.

9. The method of claim 1 wherein said polymer component comprises a silsesquioxane polymer containing said first and second moieties.

10. The method of claim 9 wherein said polymer has a weight average molecular weight of about 1000-30000.

11. The method of claim 1 wherein said crosslinking component is acid-sensitive.

12. The method of claim 11 wherein said crosslinking component comprises a compound selected from the group consisting of:

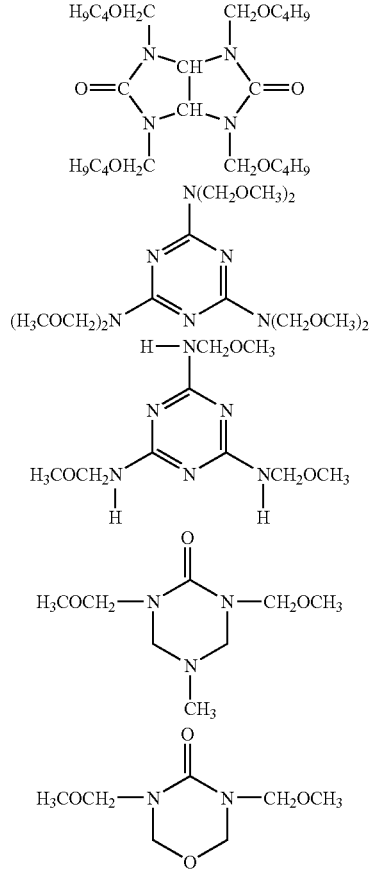

-continued

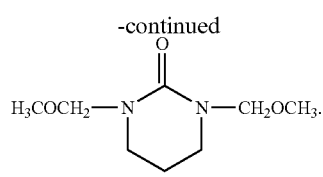

13. The method of claim 1 further comprising: providing an antireflective coating layer over said material surface, prior to step (b), such that portions of said antireflective coating layer are exposed in said spaces formed in step (d), and removing such exposed portions of antireflective coating layer prior to step (e).

14. The method of claim 1 wherein said radiation is selected from the group consisting of (a) ultraviolet radiation having a wavelength less than 250 nm, and (b) electron beam radiation.

15. The method of claim 14 wherein said radiation is electron beam radiation.

* * * * *